(12) United States Patent
Akimoto et al.

(10) Patent No.: US 9,006,764 B2
(45) Date of Patent: Apr. 14, 2015

(54) SEMICONDUCTOR LIGHT EMITTING DEVICE AND LIGHT EMITTING DEVICE

(71) Applicant: Kabushiki Kaisha Toshiba, Minato-ku, Tokyo (JP)

(72) Inventors: Yosuke Akimoto, Tokyo (JP); Akihiro Kojima, Kanagawa-ken (JP); Miyoko Shimada, Kanagawa-ken (JP); Hideyuki Tomizawa, Kanagawa-ken (JP); Yoshiaki Sugizaki, Kanagawa-ken (JP); Hideto Furuyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/848,117

(22) Filed: Mar. 21, 2013

(65) Prior Publication Data

US 2014/0231842 A1     Aug. 21, 2014

(30) Foreign Application Priority Data

Feb. 19, 2013  (JP) .................................. 2013-030331

(51) Int. Cl.
*H01L 33/44*  (2010.01)
*H01L 33/50*  (2010.01)

(52) U.S. Cl.
CPC .............. *H01L 33/507* (2013.01); *H01L 33/44* (2013.01); *H01L 33/50* (2013.01)

(58) Field of Classification Search
CPC ....... H01L 33/38; H01L 33/44; H01L 33/486; H01L 33/50; H01L 33/502; H01L 33/507
USPC ..................... 257/79, 88, 89, 98, 99
See application file for complete search history.

(56) References Cited

U.S. PATENT DOCUMENTS

| 8,110,421 B2 | 2/2012 | Sugizaki et al. |
| 2008/0080181 A1 | 4/2008 | Yu et al. |
| 2010/0237374 A1* | 9/2010 | Chu et al. ................ 257/98 |
| 2011/0073889 A1 | 3/2011 | Sugizaki et al. |
| 2011/0297983 A1* | 12/2011 | Nishiuchi et al. ............ 257/98 |

FOREIGN PATENT DOCUMENTS

| JP | 2000-311982 A | 11/2000 |
| JP | 2002-118293 A | 4/2002 |
| JP | 2006-024965 A | 1/2006 |
| JP | 2006-260969 A | 9/2006 |

(Continued)

OTHER PUBLICATIONS

JP2010009785 translation.*

(Continued)

*Primary Examiner* — Whitney T Moore
(74) *Attorney, Agent, or Firm* — Holtz, Holtz, Goodman & Chick PC

(57) ABSTRACT

According to one embodiment, a semiconductor light emitting device includes a semiconductor layer, a first electrode, a second electrode, a first insulating film, a first interconnection layer, a second interconnection layer, a first metal pillar, a second metal pillar, a second insulating film and a fluorescent material layer. The first electrode is provided in an emitting region of the semiconductor layer. The first electrode, the first insulating film, the first interconnection layer, the second interconnection layer, and the second insulating layer are configured to transmit radiated light of the light emitting layer.

20 Claims, 14 Drawing Sheets

(56) References Cited

FOREIGN PATENT DOCUMENTS

| | | |
|---|---|---|
| JP | 2008-145747 A | 6/2008 |
| JP | 2010-009785 A | 1/2010 |

OTHER PUBLICATIONS

Taiwanese Office Action dated Dec. 3, 2014, issued in counterpart Taiwanese Application No. 102109036.

* cited by examiner

US 9,006,764 B2

SEMICONDUCTOR LIGHT EMITTING DEVICE AND LIGHT EMITTING DEVICE

CROSS-REFERENCE TO RELATED APPLICATIONS

This application is based upon and claims the benefit of priority from the prior Japanese Patent Application No. 2013-030331, filed on Feb. 19, 2013; the entire contents of which are incorporated herein by reference.

FIELD

Embodiments described herein relate generally to a semiconductor light emitting device and a light emitting device.

BACKGROUND

A semiconductor light emitting device that emits visible light such as white light or light in other wavelength ranges by combining a semiconductor light emitting element and a fluorescent material is expanding the use as a small, easy-to-handle light source.

DETAILED DESCRIPTION

Figure 1:
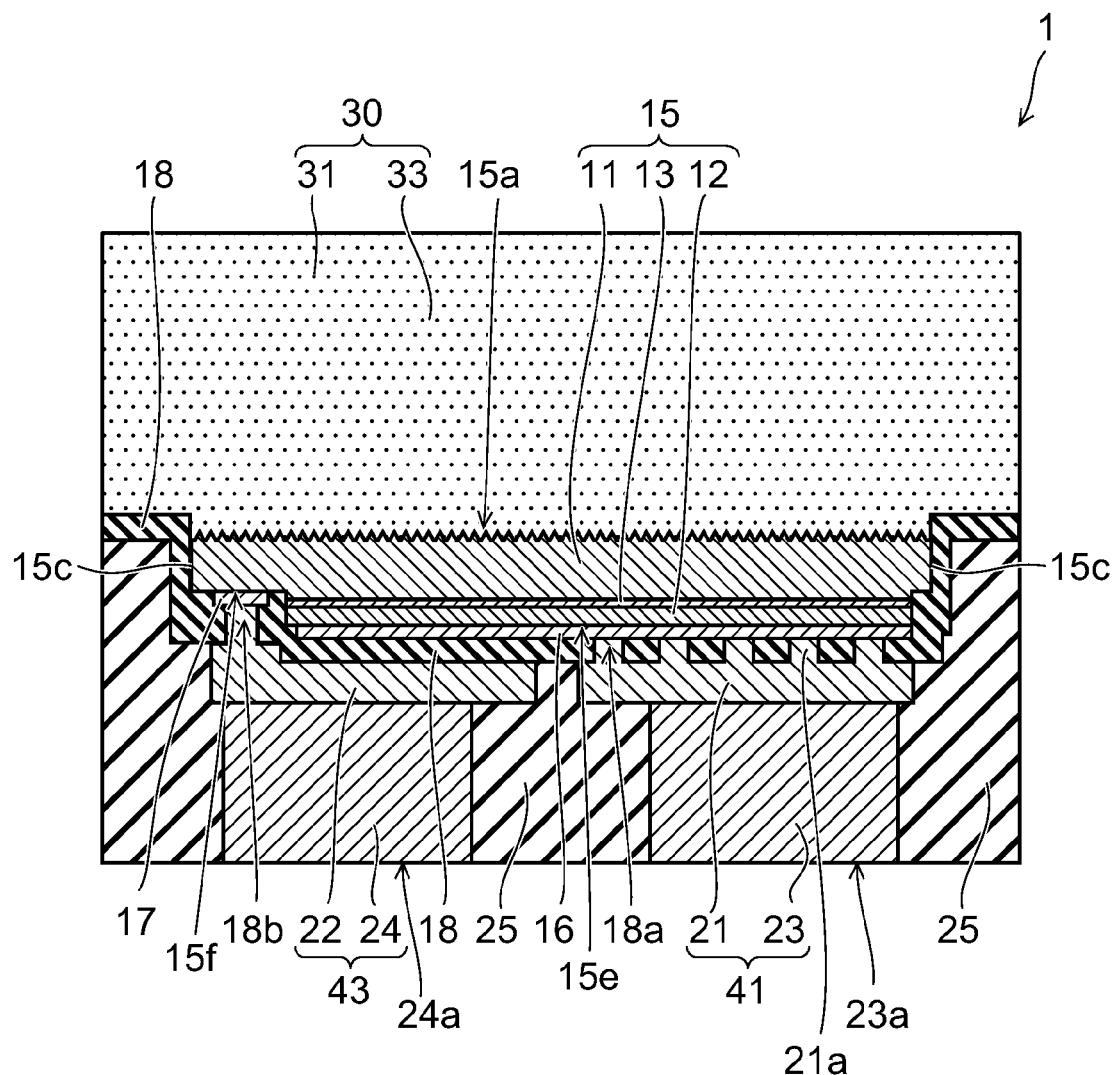
FIG. 1 is a schematic cross-sectional view of a semiconductor light emitting device of a first embodiment.

According to one embodiment, a semiconductor light emitting device includes a semiconductor layer, a first electrode, a second electrode, a first insulating film, a first interconnection layer, a second interconnection layer, a first metal pillar, a second metal pillar, a second insulating film and a fluorescent material layer. The semiconductor layer has a first surface and a second surface on an opposite side to the first surface and includes a light emitting layer. The first electrode is provided in an emitting region of the semiconductor layer on a side of the second surface and configured to transmit radiated light of the light emitting layer. The second electrode is provided in a non-emitting region of the semiconductor layer on the side of the second surface. The first insulating film is provided on the side of the second surface and configured to transmit the radiated light of the light emitting layer. The first interconnection layer is provided on the first insulating film, connected to the first electrode, and configured to transmit the radiated light of the light emitting layer. The second interconnection layer is provided on the first insulating film, connected to the second electrode, and configured to transmit the radiated light of the light emitting layer. The first metal pillar is provided on the first interconnection layer and has an externally connectable end. The second metal pillar is provided on the second interconnection layer and has an externally connectable end. The second insulating film is provided in contact with a side surface of the first metal pillar and a side surface of the second metal pillar between the first metal pillar and the second metal pillar and is configured to transmit the radiated light of the light emitting layer. The fluorescent material layer is provided on a side of the first surface. The fluorescent material layer includes a plurality of fluorescent materials and a bonding material. The fluorescent material layer is configured to be excited by the radiated light of the light emitting layer and to radiate light of a different wavelength from the radiated light of the light emitting layer. The bonding material integrates the plurality of fluorescent materials and is configured to transmit the radiated light of the light emitting layer and the radiated light of the fluorescent materials.

Various embodiments will be described hereinafter with reference to the accompanying drawings. Identical components in the drawings are marked with the same reference numerals, and a detailed description thereof is omitted as appropriate and different components are described.

First Embodiment

FIG. 1 is a schematic cross-sectional view of a semiconductor light emitting device 1 of a first embodiment.

The semiconductor light emitting device 1 includes a semiconductor layer 15 including a light emitting layer 13. The semiconductor layer 15 has a first surface 15a and a second surface 15b on the opposite side to it (see FIG. 5A). The semiconductor layer 15 has a portion (an emitting region) 15e including the light emitting layer 13 and a portion (a non-emitting region) 15f not including the light emitting layer 13. The portion 15e including the light emitting layer 13 is a portion of the semiconductor layer 15 where the light emitting layer 13 is stacked. The portion 15f not including the light emitting layer 13 is a portion of the semiconductor layer 15 where the light emitting layer 13 is not stacked. The portion including the light emitting layer 13 shows the emitting region, and shows the region of a stacked structure that includes the light emitting layer 13 and is capable of extracting the radiated light of the light emitting layer 13 to the outside.

On the second surface 15b side, a p-side electrode 16 is provided as a first electrode on the portion 15e including the light emitting layer 13, and an n-side electrode 17 is provided as a second electrode on the portion 15f not including the light emitting layer. A current is supplied to the light emitting layer 13 via the p-side electrode 16 and the n-side electrode 17, and the light emitting layer 13 emits light.

The p-side electrode 16 provided in the emitting region of the semiconductor layer 15 on the second surface side is a transparent electrode transmissive to the radiated light of the light emitting layer 13. The p-side electrode 16 is made of, for example, ITO (indium tin oxide). Here, "transmissive" and "transparent" include also the case of absorbing part of the light.

A support body described later is provided on the second surface side of the semiconductor layer 15. A light emitting element including the semiconductor layer 15, the p-side electrode 16, and the n-side electrode 17 is supported by the support body provided on the second surface side.

A fluorescent material layer 30 is provided on the first surface 15a of the semiconductor layer 15. The fluorescent material layer 30 contains a plurality of fluorescent materials 31. The fluorescent material 31 is excited by the radiated light of the light emitting layer 13, and emits light of a different wavelength from the radiated light of the light emitting layer 13.

The plurality of fluorescent materials 31 are integrated by a bonding material 33. The bonding material 33 transmits the radiated light of the light emitting layer 13 and the radiated light of the fluorescent material 31.

The semiconductor layer 15 includes a first semiconductor layer 11, a second semiconductor layer 12, and the light emitting layer 13. The light emitting layer 13 is provided between the first semiconductor layer 11 and the second semiconductor layer 12. The first semiconductor layer 11 and the second semiconductor layer 12 contain, for example, gallium nitride.

The first semiconductor layer 11 includes, for example, an underlying buffer layer and an n-type GaN layer. The second semiconductor layer 12 includes, for example, a p-type GaN layer. The light emitting layer 13 contains a material that emits blue light, violet light, bluish violet light, ultraviolet light, etc. The emission wavelength of the light emitting layer 13 is, for example, 430 to 470 nm.

The second surface of the semiconductor layer 15 is fashioned in a concave-convex form. The convex portion of the concavity and convexity is the portion 15e including the light emitting layer 13, and the concave portion is the portion 15f not including the light emitting layer 13. The second surface of the portion 15e including the light emitting layer 13 is a surface of the second semiconductor layer 12, and the p-side electrode 16 is provided on the surface. The second surface of the portion 15f not including the light emitting layer 13 is a surface of the first semiconductor layer 11, and the n-side electrode 17 is provided on the surface.

In the second surface of the semiconductor layer 15, for example, the area of the portion 15e including the light emitting layer 13 is larger than the area of the portion 15f not including the light emitting layer 13. The area of the p-side electrode 16 provided on the portion 15e including the light emitting layer 13 is larger than the area of the n-side electrode 17 provided on the portion not including the light emitting layer 13. Thereby, a large light emitting surface is obtained, and the light output can be increased.

An insulating film 18 is provided as a first insulating film on the second surface side of the semiconductor layer 15. The insulating film 18 covers and protects the second surface of the semiconductor layer 15, the p-side electrode 16, and the n-side electrode 17.

The insulating film 18 is provided also on the side surface of the light emitting layer 13 and the side surface of the second semiconductor layer 12, and covers these side surfaces. The insulating film 18 is provided also on a side surface (a side surface of the first semiconductor layer 11) 15c continuing from the first surface 15a of the semiconductor layer 15, and covers the side surface 15c. The insulating film 18 is not provided on the first surface 15a of the semiconductor layer 15.

The insulating film 18 is an inorganic transparent insulating film transmissive to the radiated light of the light emitting layer 13. The insulating film 18 is, for example, a silicon oxide film or a silicon nitride film.

On a surface of the insulating film 18 on the opposite side to the semiconductor layer 15, a p-side interconnection layer 21 as a first interconnection layer and an n-side interconnection layer 22 as a second interconnection layer are provided away from each other. The insulating film 18 includes a first opening 18a leading to the p-side electrode 16 and a second opening 18b leading to the n-side electrode 17. Although the insulating film 18 includes a plurality of first openings 18a in the example shown in FIG. 1, also a configuration including one first opening 18a is possible.

The p-side interconnection layer 21 is provided on the insulating film 18 and inside the first opening 18a. The p-side interconnection layer 21 is electrically connected to the p-side electrode 16 via a via 21a provided in the first opening 18a. The n-side interconnection layer 22 is provided on the insulating film 18 and in the second opening 18b. The n-side interconnection layer 22 is electrically connected to the n-side electrode 17 through a via provided in the second opening 18b.

The p-side interconnection layer 21 and the n-side interconnection layer 22 are a transparent conductive film transmissive to the radiated light of the light emitting layer 13. The p-side interconnection layer 21 and the n-side interconnection layer 22 are made of, for example, ITO (indium tin oxide).

A p-side metal pillar 23 is provided as a first metal pillar on a surface of the p-side interconnection layer 21 on the opposite side to the p-side electrode 16. A p-side interconnection unit 41 as a first interconnection unit includes the p-side interconnection layer 21 and the p-side metal pillar 23.

An n-side metal pillar 24 is provided as a second metal pillar on a surface of the n-side interconnection layer 22 on the opposite side to the n-side electrode 17. An n-side interconnection unit 43 as a second interconnection unit includes the n-side interconnection layer 22 and the n-side metal pillar 24.

An insulating film 25 is provided as a second insulating film between the p-side interconnection unit 41 and the n-side interconnection unit 43. The insulating film 25 is provided between the p-side interconnection layer 21 and the n-side interconnection layer 22 so as to be in contact with the side surface of the p-side interconnection layer 21 and the side surface of the n-side interconnection layer 22. The insulating film 25 is provided between the p-side metal pillar 23 and the n-side metal pillar 24 so as to be in contact with the side surface of the p-side metal pillar 23 and the side surface of the n-side metal pillar 24. That is, the insulating film 25 is put in between the p-side interconnection layer 21 and the n-side interconnection layer 22 and between the p-side metal pillar 23 and the n-side metal pillar 24.

The insulating film 25 covers the side surface of the p-side interconnection layer 21, the side surface of the n-side interconnection layer 22, the side surface of the p-side metal pillar 23, and the side surface of the n-side metal pillar 24. The insulating film 25 is provided around the p-side metal pillar 23 and around the n-side metal pillar 24.

An end (surface) of the p-side metal pillar 23 on the opposite side to the p-side interconnection layer 21 is exposed from the insulating film 25, and functions as a p-side external terminal (a first external terminal) 23a connectable to an external circuit of a mounting substrate etc. An end (surface) of the n-side metal pillar 24 on the opposite side to the n-side interconnection layer 22 is exposed from the insulating film 25, and functions as an n-side external terminal (a second external terminal) 24a connectable to the external circuit of the mounting substrate etc.

The p-side external terminal 23a and the n-side external terminal 24a are exposed at the same surface (the lower surface in FIG. 1) of the insulating film 25. The spacing between the p-side external terminal 23a and the n-side external terminal 24a is wider than the spacing between the p-side interconnection layer 21 and the n-side interconnection layer 22 on the insulating film 18. The spacing between the p-side external terminal 23a and the n-side external terminal 24a is set larger than the spread of a solder in the time of mounting. Thereby, a short circuit between the p-side external terminal 23a and the n-side external terminal 24a via the solder can be prevented.

In contrast, the spacing between the p-side interconnection layer 21 and the n-side interconnection layer 22 may be set narrow up to the limit in terms of processes. Hence, the area of the p-side interconnection layer 21 and the contact area between the p-side interconnection layer 21 and the p-side metal pillar 23 can be enlarged. Thereby, the radiation of heat of the light emitting layer 13 can be promoted.

The area with which the p-side interconnection layer 21 is in contact with the p-side electrode 16 via the plurality of first openings 18a is larger than the area with which the n-side interconnection layer 22 is in contact with the n-side electrode 17 via the second opening 18b. Thereby, the distribution of the current flowing through the light emitting layer 13 can be equalized.

The n-side interconnection layer 22 extends on the insulating film 18 provided on the p-side electrode 16. That is, the n-side interconnection layer 22 extends on the emitting region in which the light emitting layer 13 and the p-side electrode 16 are provided.

The area of the n-side interconnection layer 22 spreading on the insulating film 18 is larger than the contact area between the n-side interconnection layer 22 and the n-side electrode 17. The contact area between the n-side interconnection layer 22 and the n-side metal pillar 24 is larger than the contact area between the n-side interconnection layer 22 and the n-side electrode 17.

The area of the n-side interconnection layer 22 spreading on the insulating film 18 may be larger than the area of the n-side electrode 17. The area of the n-side metal pillar 24 provided on the n-side interconnection layer 22 (that is, the area of the n-side external terminal 24a) may be larger than the n-side electrode 17. Thereby, the area of the n-side electrode 17 can be made small while a sufficient area of the n-side external terminal 24a for mounting with high reliability is ensured. That is, the area of the portion (non-emitting region) 15f not including the light emitting layer 13 of the semiconductor layer 15 can be reduced, and the area of the portion (emitting region) 15e including the light emitting layer 13 can be enlarged; thereby, the light output can be increased.

The first semiconductor layer 11 is electrically connected to the n-side metal pillar 24 via the n-side electrode 17 and the n-side interconnection layer 22. The second semiconductor layer 12 is electrically connected to the p-side metal pillar 23 via the p-side electrode 16 and the p-side interconnection layer 21.

The p-side metal pillar 23 is thicker than the p-side interconnection layer 21, and the n-side metal pillar 24 is thicker than the n-side interconnection layer 22. The thickness of each of the p-side metal pillar 23, the n-side metal pillar 24, and the insulating film 25 is thicker than the thickness of the semiconductor layer 15. The "thickness" herein is the width of each layer in the vertical direction in FIG. 1.

The aspect ratio (the ratio of the thickness to the planar size) of the metal pillars 23 and 24 may be 1 or more, or smaller than 1. That is, the metal pillars 23 and 24 may be either thicker or thinner than the planar size thereof.

The thickness of the support body including the p-side interconnection layer 21, the n-side interconnection layer 22, the p-side metal pillar 23, the n-side metal pillar 24, and the insulating film 25 is thicker than the thickness of the light emitting element including the semiconductor layer 15, the p-side electrode 16, and the n-side electrode 17.

As described later, the semiconductor layer 15 is formed on a substrate by the epitaxial growth method. The substrate is removed after the support body including the n-side interconnection layer 22, the p-side metal pillar 23, the n-side metal pillar 24, and the insulating film 25 is formed, and the semiconductor layer 15 does not include a substrate on the first surface 15a side. The semiconductor layer 15 is supported by the support body including the insulating film 25 more flexible than the semiconductor layer 15, not by a rigid substrate.

As the material of the p-side metal pillar 23 and the n-side metal pillar 24, for example, copper, gold, nickel, silver, and the like may be used. Of these, when copper is used, good thermal conductivity and high migration resistance can be obtained, and the adhesion to insulating materials can be improved.

The insulating film 25 reinforces the p-side metal pillar 23 and the n-side metal pillar 24. The insulating film 25 is made of a transparent insulating material transmissive to the radiated light of the light emitting layer 13. The insulating film 25 is made of, for example, a transparent resin such as a silicone resin and an epoxy resin or glass.

In the process of mounting the semiconductor light emitting device 1, the stress due to a solder or the like for bonding the p-side external terminal 23a and the n-side external terminal 24a to the land of the mounting substrate is applied to the semiconductor layer 15. The p-side metal pillar 23, the n-side metal pillar 24, and the insulating film 25 absorb and relax the stress. In particular, by using the insulating film 25 more flexible than the semiconductor layer 15 as part of the support body, the stress relaxation effect can be enhanced.

The p-side interconnection unit 41 including the p-side interconnection layer 21 and the p-side metal pillar 23 is connected to the p-side electrode 16 via the plurality of vias 21a provided in the plurality of first openings 18a away from one another. In this case, the stress applied to the semiconductor layer 15 can be more reduced than in the case where the p-side interconnection unit 41 is connected to the p-side electrode 16 via one via having an area equal to the total of the contact areas of the plurality of vias 21a.

On the other hand, the p-side interconnection layer 21 may be connected to the p-side electrode 16 via a post with a larger planar size than the via 21a provided in one large opening. Thereby, heat dissipation via the p-side electrode 16, the p-side interconnection layer 21, and the p-side metal pillar 23 can be improved.

As described later, the substrate used for the formation of the semiconductor layer 15 is removed from the semiconductor layer 15. Thereby, the height of the semiconductor light emitting device 1 is reduced. By the removal of the substrate, concavity and convexity can be formed on the first surface 15a of the semiconductor layer 15, and the light extraction efficiency can be improved.

For example, wet etching using an alkali-based solution (frost treatment) is performed on the first surface 15a to form fine concavity and convexity. Thereby, the radiated light of the light emitting layer 13 can be extracted to the outside from the first surface 15a without being totally reflected.

After the substrate is removed, the fluorescent material layer 30 is formed on the first surface 15a of the semiconductor layer 15. That is, the fluorescent material layer 30 is provided on the first surface 15a without interposing a substrate between the first surface 15a of the semiconductor layer 15 and the fluorescent material layer 30.

The fluorescent material layer 30 has a structure in which a plurality of particulate fluorescent materials 31 are scattered in the bonding material 33. The fluorescent material 31 contains, for example, at least one kind of fluorescent material of a yellow fluorescent material that emits yellow light, a red fluorescent material that emits red light, and a green fluorescent material that emits green light, by being excited by the radiated light of the light emitting layer 13. The fluorescent material 31 may be a ceramic-based fine particle. For the bonding material 33, for example, a silicone resin may be used.

The fluorescent material layer 30 contains one kind of fluorescent material (e.g. a yellow fluorescent material). Alternatively, the fluorescent material layer 30 contains a plurality of kinds of fluorescent materials (e.g. a red fluorescent material and a green fluorescent material).

The semiconductor light emitting device 1 of the embodiment has a structure near to a chip size. The fluorescent material layer 30 is limited to on the first surface 15a and on the insulating film 18, which is part of the support body, and is not formed to go round to the second surface side of the semiconductor layer 15 and the side surface of the support body.

The radiated light of the light emitting layer 13 travels to the fluorescent material layer 30 via the first surface 15a, and excites the fluorescent material 31. That is, light of a mixed color of the radiated light of the light emitting layer 13 and the radiated light of the fluorescent material 31 is obtained from the fluorescent material layer 30 side.

The radiated light of the light emitting layer 13 is emitted also to the second surface side of the semiconductor layer 15. In the embodiment, the p-side electrode 16 provided in the emitting region on the second surface side is transparent to the radiated light of the light emitting layer 13. Also the insulating film 18, the p-side interconnection layer 21, the n-side interconnection layer 22, and the insulating film 25 provided on the second surface side are transparent to the radiated light of the light emitting layer 13.

Therefore, the radiated light of the light emitting layer 13 radiated to the second surface side is transmitted through the p-side electrode 16, the insulating film 18, the p-side interconnection layer 21, and the n-side interconnection layer 22; is further transmitted through the insulating film 25 between the p-side metal pillar 23 and the n-side metal pillar 24; and is radiated to the outside of the semiconductor light emitting device 1.

That is, in the embodiment, in the semiconductor light emitting device 1 of a chip size package structure, light is radiated from two different surfaces located on opposite sides across the light emitting layer 13.

Figure 2:
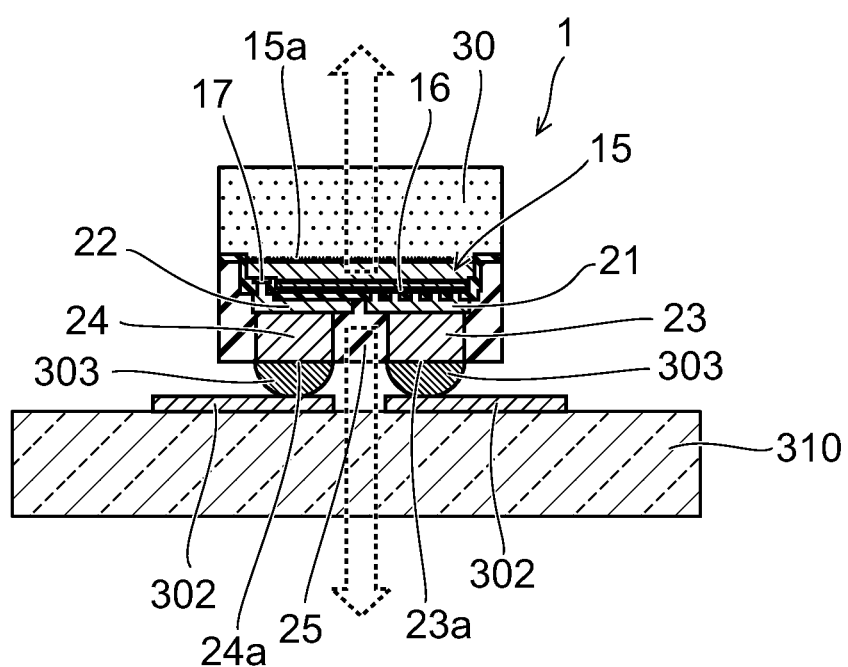
FIG. 2 is a schematic cross-sectional view of a light emitting device including the semiconductor light emitting device of the embodiment.

FIG. 2 is a schematic cross-sectional view of a light emitting device including the semiconductor light emitting device 1 of the embodiment.

The light emitting device of the embodiment includes a mounting substrate 310 and the semiconductor light emitting device 1 mounted on the mounting substrate 310.

The mounting substrate 310 is a transparent insulating substrate transmissive to the radiated light of the light emitting layer 13. The mounting substrate 310 is, for example, a glass substrate or a transparent resin substrate. The mounting substrate 310 may be a flexible substrate having flexibility.

On one surface (mounting surface) of the mounting substrate 310, pads 302 and an interconnection pattern (not shown) connected to the pads 302 are formed.

The semiconductor light emitting device 1 is formed to have an external shape of, for example, a rectangular parallelepiped. The semiconductor light emitting device 1 includes the p-side external terminal 23a and the n-side external terminal 24a exposed at the same surface. The semiconductor light emitting device 1 is mounted on the mounting substrate 310 in a state where the surface at which the p-side external terminal 23a and the n-side external terminal 24a are exposed is opposed to the mounting surface of the mounting substrate 310 and the fluorescent material layer 30 is opposed to the opposite side to the mounting surface of the mounting substrate 310.

The p-side external terminal 23a and the n-side external terminal 24a are bonded to the pads 302 via, for example, a conductive bonding material such as a solder 303.

As described above, in the semiconductor light emitting device 1, light is radiated from two different surfaces (the upper surface and the lower surface in FIG. 2) located on opposite sides across the light emitting layer 13. The light emitted to the opposite side to the fluorescent material layer 30 (the second surface side) is transmitted through the transparent mounting substrate 310. Therefore, light is radiated also to the back surface side of the mounting substrate 310, and the application range of the light emitting device can be expanded.

Figure 3:
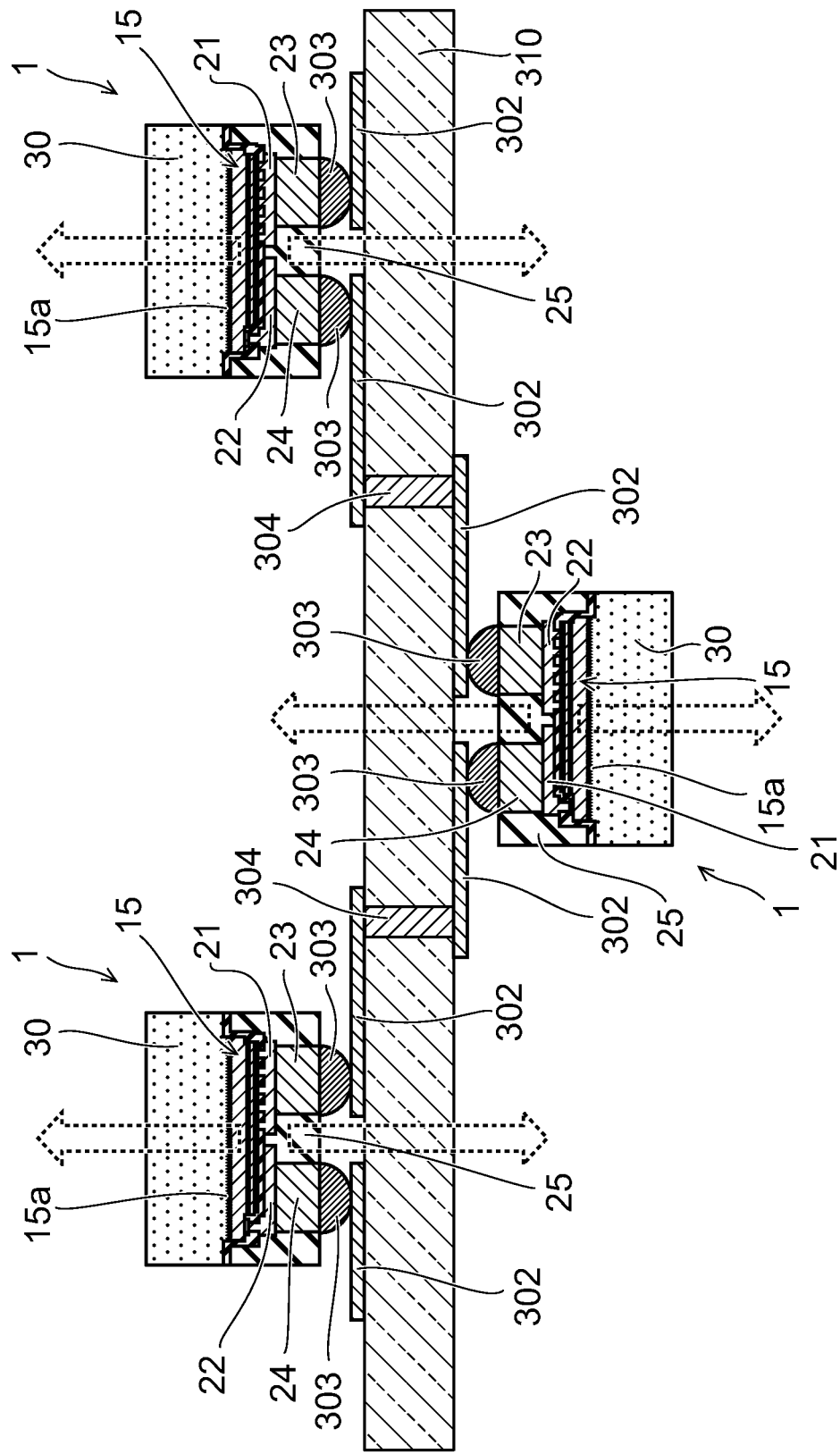
FIG. 3 is a schematic cross-sectional view of a light emitting device including the semiconductor light emitting device of the embodiment.

FIG. 3 is a schematic cross-sectional view of a light emitting device including the semiconductor light emitting device 1 of the embodiment in plural.

The light emitting device shown in FIG. 3 includes the mounting substrate 310 and a plurality of semiconductor light emitting devices 1 mounted on the mounting substrate 310. The plurality of semiconductor light emitting devices 1 are mounted on both surfaces of the mounting substrate 310.

The mounting substrate 310 is a transparent insulating substrate transmissive to the radiated light of the light emitting layer 13. The mounting substrate 310 is, for example, a glass substrate or a transparent resin substrate. The mounting substrate 310 may be a flexible substrate having flexibility.

On each of both surfaces of the mounting substrate 310, pads 302 and an interconnection pattern (not shown) connected to the pads 302 are formed.

The pads 302 or the interconnection patterns of both surfaces are electrically connected via vias 304 provided to pierce the mounting substrate 310.

The semiconductor light emitting device 1 is formed to have an external shape of, for example, a rectangular parallelepiped. The semiconductor light emitting device 1 includes the p-side external terminal 23a and the n-side external terminal 24a exposed at the same surface. The semiconductor light emitting device 1 is mounted on the mounting substrate 310 in a state where the surface at which the p-side external terminal 23a and the n-side external terminal 24a are exposed is opposed to the mounting surface of the mounting substrate 310 and the fluorescent material layer 30 is opposed to the opposite side to the mounting surface of the mounting substrate 310.

The p-side external terminal 23a and the n-side external terminal 24a are bonded to the pads 302 via, for example, a conductive bonding material such as the solder 303.

In the semiconductor light emitting device 1, light is radiated from two different surfaces located on opposite sides across the light emitting layer 13. The light radiated to the opposite side to the fluorescent material layer 30 (the second surface side) is transmitted through the transparent mounting substrate 310. Therefore, light is radiated also to the back surface side of the mounting substrate 310, and the application range of the light emitting device can be expanded. The light emitting device of the embodiment can be used for, for example, a configuration shaped like a filament, and can be used as lighting equipment having a wide light distribution such as an electric light bulb.

A semiconductor light emitting device 1 mounted on one surface of the mounting substrate 310 and a semiconductor light emitting device 1 mounted on the other surface of the mounting substrate 310 are mounted in positions not overlapping with each other across the mounting substrate. That is, in the cross-sectional view of FIG. 3, a plurality of semiconductor light emitting devices 1 are arranged in a zigzag fashion.

In FIG. 3, there is no other semiconductor light emitting device 1 located under a semiconductor light emitting device 1 mounted on the upper mounting surface, and there is no other semiconductor light emitting device 1 located over a semiconductor light emitting device 1 mounted on the lower mounting surface.

Therefore, the light radiated to the second surface side from the light emitting layer 13 of the semiconductor light emitting device 1 can be radiated to the side of the opposite surface to the surface on which itself is mounted, without being obstructed by another semiconductor light emitting device 1.

In a configuration in which the semiconductor light emitting device 1 is mounted only on one surface, the emission intensity is relatively weak between semiconductor light emitting devices 1 adjacent on the one surface. That is, emission unevenness is brought about as the whole light emitting device.

As a method for improving the emission unevenness, there may be a method that increases the density of mounted semiconductor light emitting devices 1 to narrow the spacing between adjacent semiconductor light emitting devices 1. However, if the spacing between semiconductor light emitting devices 1 becomes narrow, it is feared that a reduction in heat dissipation will be caused.

In the embodiment, the semiconductor light emitting device 1 that emits light from both surfaces is mounted on both surfaces of the transparent mounting substrate 310. Therefore, the reduction in the emission intensity between semiconductor light emitting devices 1 on one mounting surface side can be compensated for by the radiated light to the second surface side of a semiconductor light emitting device 1 mounted on the other mounting surface.

Thus, the embodiment can achieve emission uniformity of both surfaces of the mounting substrate 310, while suppressing the density of semiconductor light emitting devices 1 mounted on each mounting surface.

Next, a method for manufacturing the semiconductor light emitting device 1 of the embodiment is described with reference to FIG. 4A to FIG. 11B.

Figure 4A:
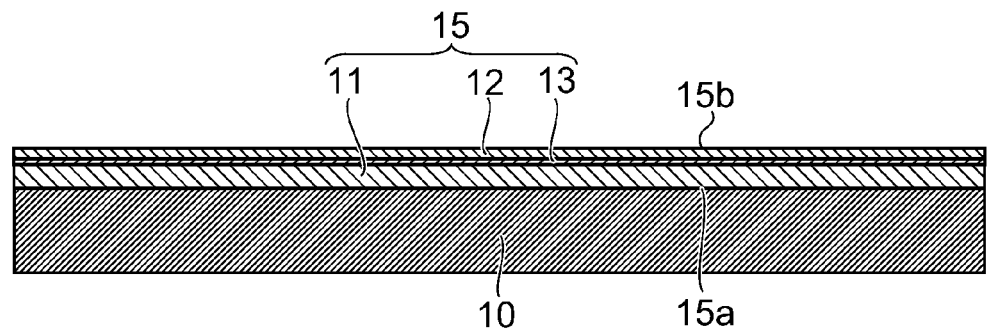
FIG. 4A to FIG. 11B are schematic views showing a method for manufacturing the semiconductor device according to the first embodiment.

FIG. 4A is a cross-sectional view showing the semiconductor layer 15 including the first semiconductor layer 11, the light emitting layer 13, and the second semiconductor layer 12 formed on the major surface of a substrate 10. For example, the MOCVD (metal organic chemical vapor deposition) method is used to sequentially grow the first semiconductor layer 11, the light emitting layer 13, and the second semiconductor layer 12 on the substrate 10.

The substrate 10 is, for example, a silicon substrate or a sapphire substrate. The semiconductor layer 15 is, for example, a nitride semiconductor containing gallium nitride (GaN).

The first semiconductor layer 11 is, for example, an n-type GaN layer. The first semiconductor layer 11 may have a stacked structure including a buffer layer provided on the substrate 10 and an n-type GaN layer provided on the buffer layer. The second semiconductor layer 12 includes, for example, a p-type AlGaN layer provided on the light emitting layer 13 and a p-type GaN layer provided on the p-type AlGaN layer. The light emitting layer 13 has, for example, an MQW (multiple quantum well) structure.

Figure 4B:
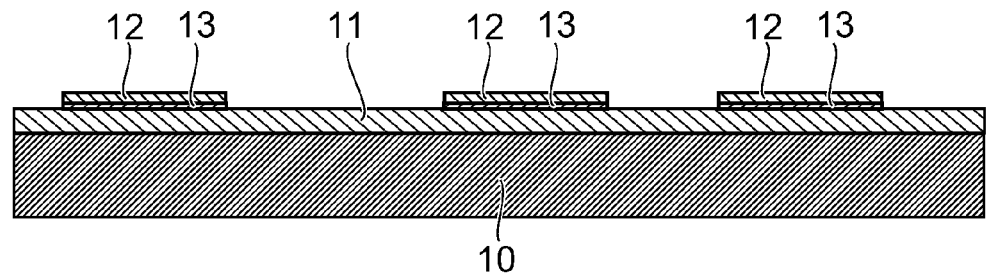
Figure 4C:
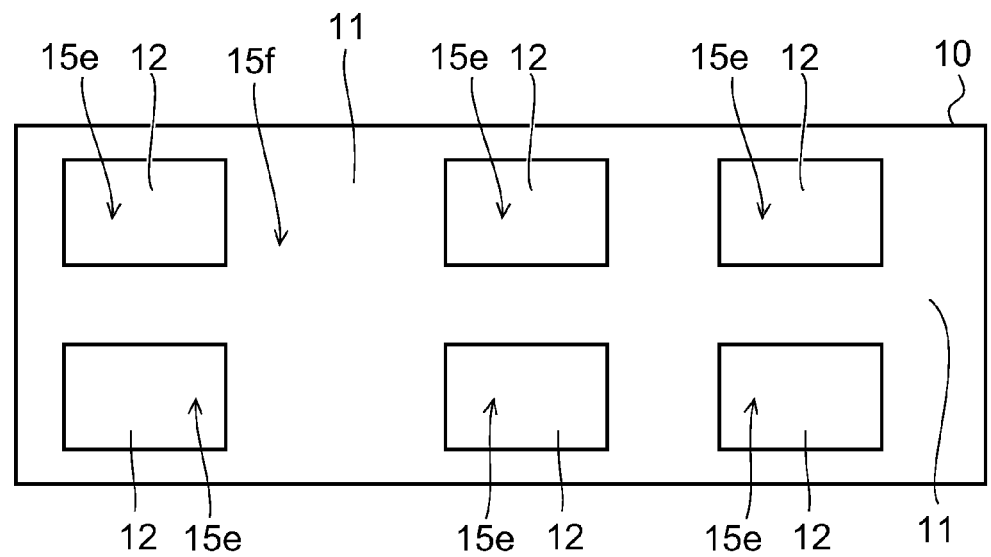

FIG. 4B and FIG. 4C show a state where the second semiconductor layer 12 and the light emitting layer 13 are selectively removed. FIG. 4B is a cross-sectional view, and FIG. 4C is a plan view showing the upper surface side of the substrate 10 (the second surface side of the semiconductor layer 15).

The RIE (reactive ion etching) method, for example, is used to selectively etch the second semiconductor layer 12 and the light emitting layer 13 to expose the first semiconductor layer 11.

As shown in FIG. 4C, the semiconductor layer 12 and the light emitting layer 13 are patterned into an island configuration on the first semiconductor layer 11, and a plurality of emitting regions (portions 15e including the light emitting layer 13) are formed on the substrate 10.

Figure 5A:
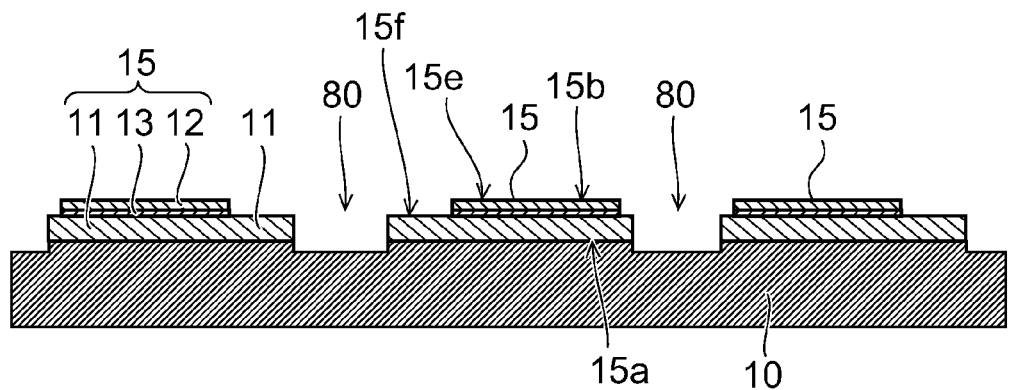
Figure 5B:
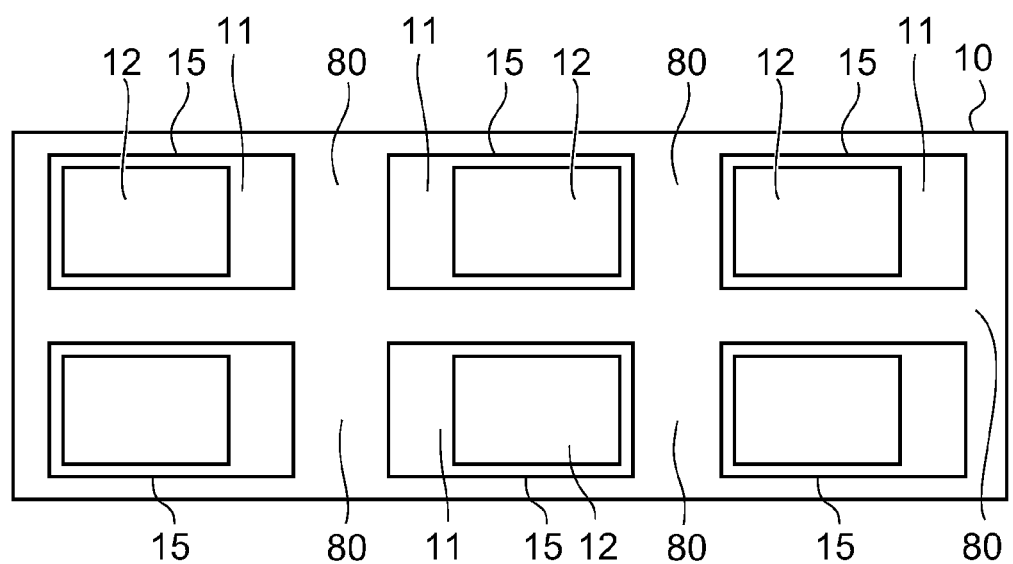

Next, as shown in FIG. 5A and FIG. 5B, the first semiconductor layer 11 is selectively removed. A plurality of semiconductor layers 15 separated from one another are formed on the substrate 10.

FIG. 5A shows a cross section of the substrate 10 and the semiconductor layer 15 formed thereon. For example, an etching mask (not shown) covering the second semiconductor layer 12 and the light emitting layer 13 is provided on the first semiconductor layer 11. Subsequently, the RIE method is used to etch the first semiconductor layer 11 to form a trench 80 with a depth reaching the substrate 10.

FIG. 5B shows the upper surface of FIG. 5A. The trench 80 is provided in a lattice configuration on the substrate 10, and separates the first semiconductor layer 11.

The first surface 15a of the semiconductor layer 15 is a surface in contact with the substrate 10, and the second surface 15b is surfaces of the first semiconductor layer 11 and the second semiconductor layer 12.

For example, the upper surface of the substrate 10, which is a silicon substrate, is etched at some level, and the trench 80 is formed deeper than the first surface 15a.

The trench 80 may be formed after the p-side electrode 16 and the n-side electrode 17 described later are formed.

Figure 6A:
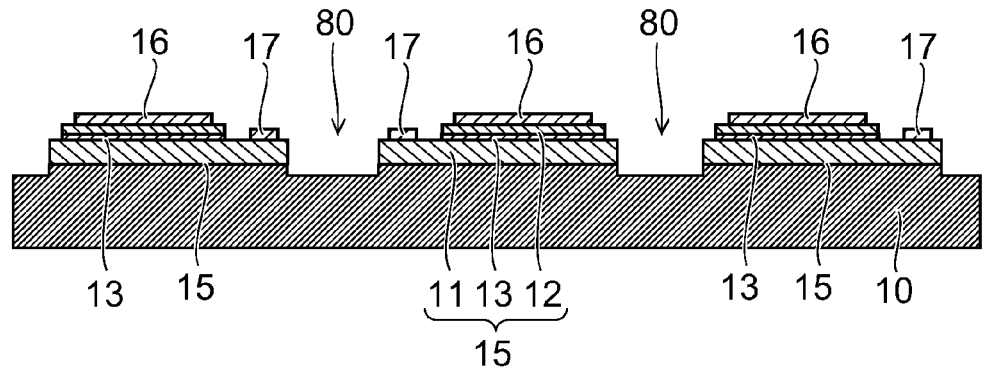
Figure 6B:
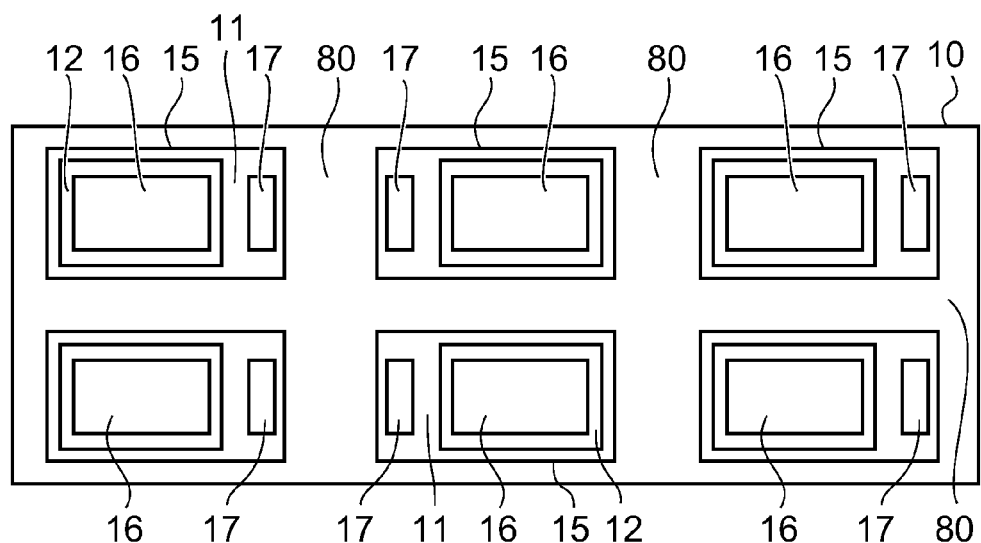

Next, as shown in FIG. 6A and FIG. 6B, the p-side electrode 16 and the n-side electrode 17 are formed on the second surface 15b of the semiconductor layer 15. FIG. 6A is a cross-sectional view, and FIG. 6B shows the upper surface of FIG. 6A.

The p-side electrode 16 is formed on the second semiconductor layer 12 (on the emitting region). The n-side electrode 17 is formed on the first semiconductor layer 11 (on the non-emitting region). The p-side electrode 16 has a larger area than the n-side electrode 17.

The p-side electrode 16 and the n-side electrode 17 are formed by, for example, the sputtering method, the vapor deposition method, or the like. Either the p-side electrode 16 or the n-side electrode 17 may be formed earlier, or both may be formed simultaneously using the same material. The p-side electrode 16 is a transparent electrode that transmits the radiated light of the light emitting layer 13, and is made of, for example, ITO.

Figure 7A:
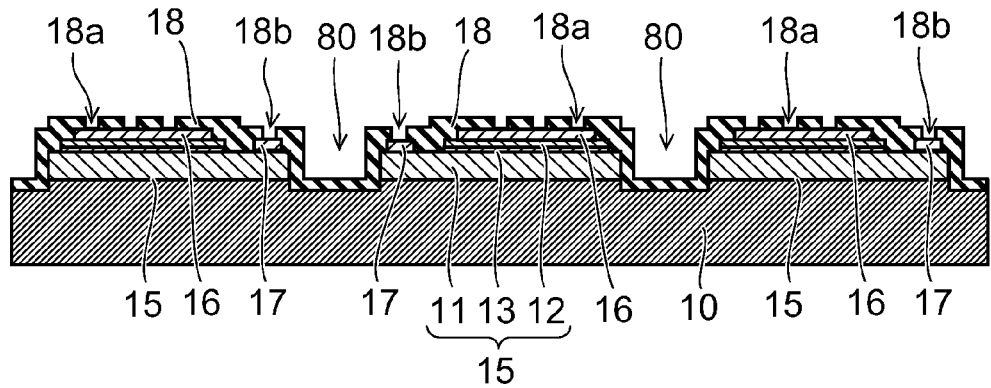

Next, as shown in FIG. 7A, the insulating film 18 is formed on the upper surface of the substrate 10. FIG. 7A is a schematic view showing a cross section of the substrate 10 and the structure on the substrate 10.

The insulating film 18 covers the structure provided on the substrate 10, and has the first opening 18a and the second opening 18b.

The insulating film 18 is, for example, a silicon oxide film or a silicon nitride film, and may be formed using the CVD (chemical vapor deposition) method. The openings 18a and 18b are formed by, for example, wet etching using a resist mask. The first opening 18a leads to the p-side electrode 16. The second opening 18b leads to the n-side electrode 17.

Figure 7B:
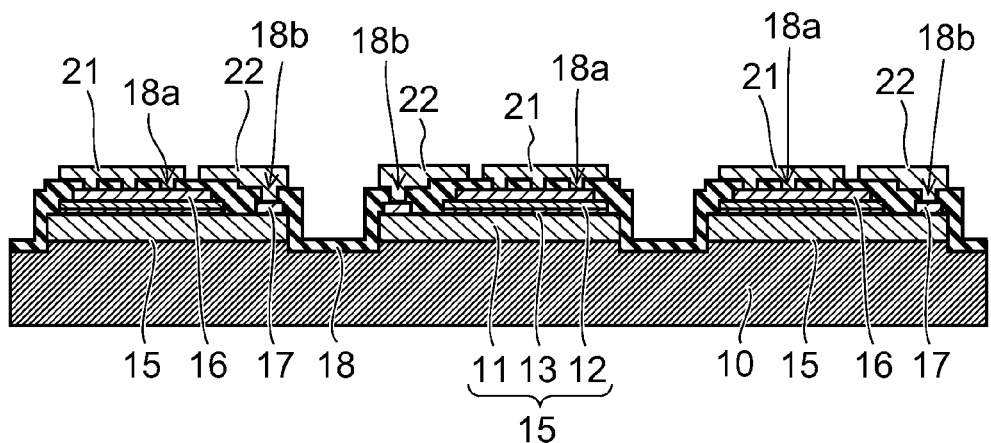
Figure 7C:
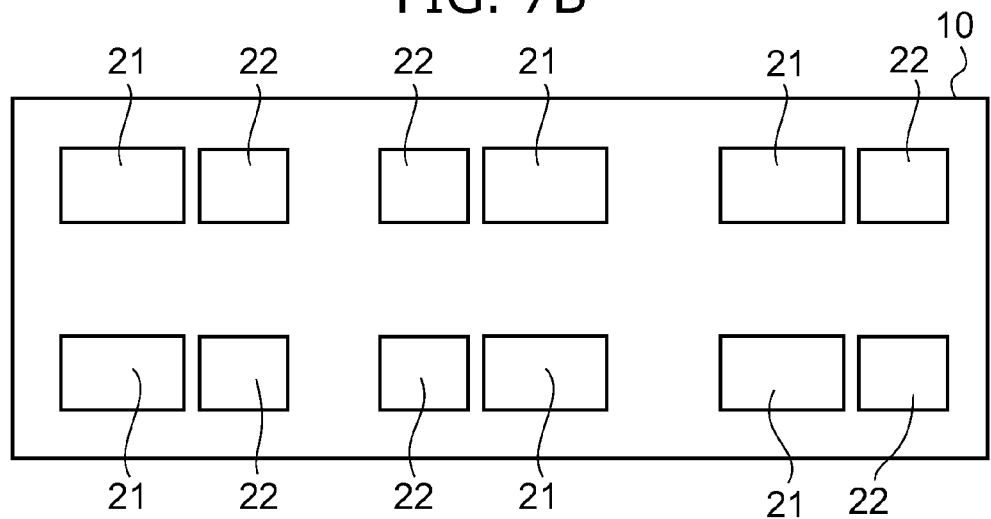

Next, FIGS. 7B and 7C show the processes of forming the p-side interconnection layer 21 and the n-side interconnection layer 22. FIG. 7B is a schematic view showing a cross section of the substrate 10 and the structure on the substrate 10, and FIG. 7C shows the upper surface of FIG. 7B.

The p-side interconnection layer 21 and the n-side interconnection layer 22 are formed by, for example, the sputtering method. The p-side interconnection layer 21 is formed on the insulating film 18 and inside the first opening 18a. The p-side interconnection layer 21 is electrically connected to the p-side electrode 16. The n-side interconnection layer 22 is formed on the insulating film 18 and inside the second opening 18b. The n-side interconnection layer 22 is electrically connected to the n-side electrode 17.

Figure 8A:
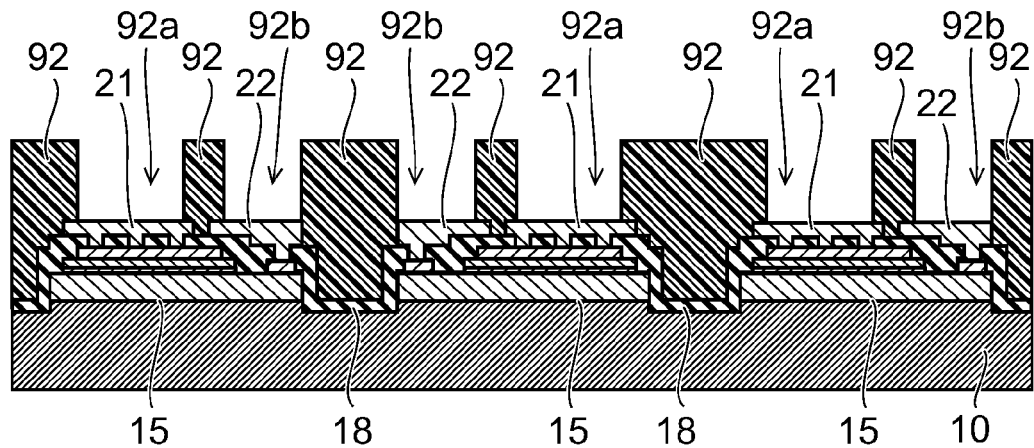
Figure 8B:
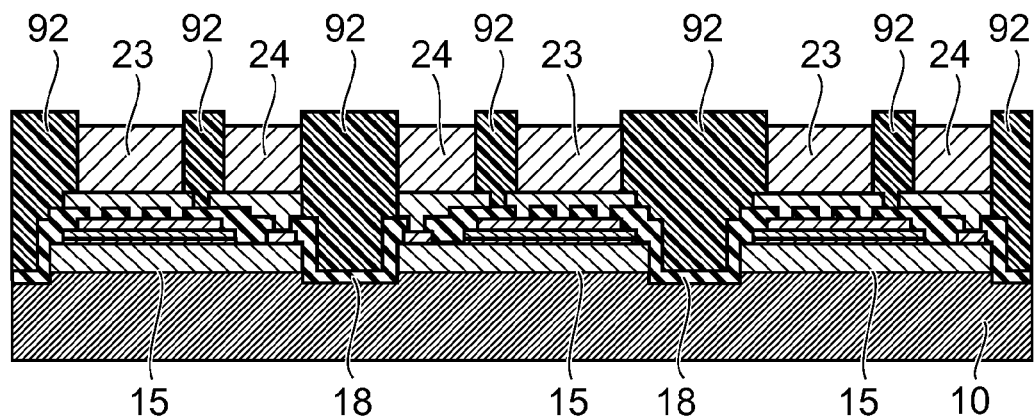
Figure 8C:
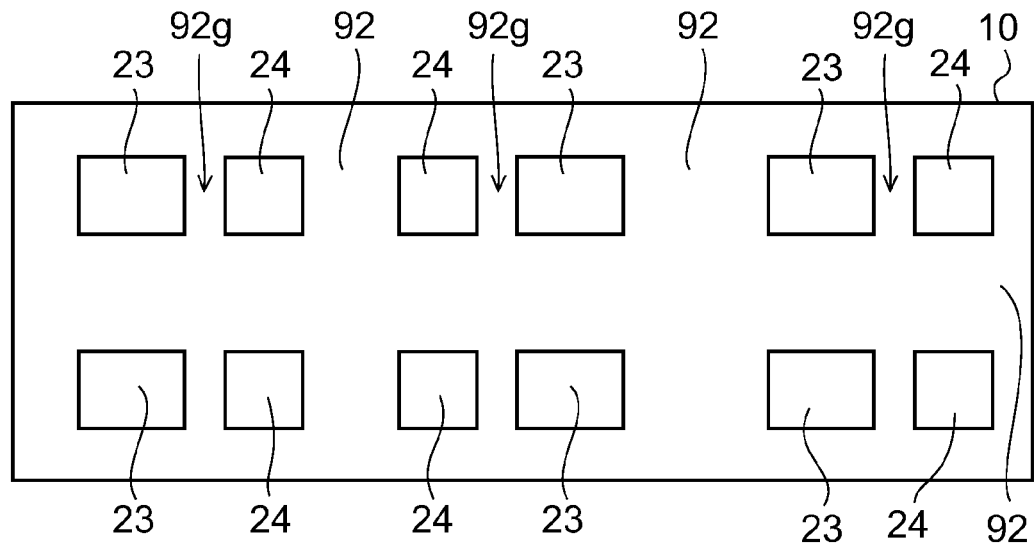

Next, FIGS. 8A to 8C show the processes of forming the p-side metal pillar 23 and the n-side metal pillar 24. FIG. 8A and FIG. 8B are schematic views showing a cross section of the substrate 10 and the structure on the substrate 10, and FIG. 8C shows the upper surface of FIG. 8B.

As shown in FIG. 8A, a resist mask 92 having an opening 92a and an opening 92b is formed. For example, photolithography is used to form the resist mask 92.

Subsequently, as shown in FIG. 8B, the p-side metal pillar 23 and the n-side metal pillar 24 are formed in the openings 92a and 92b, respectively. The p-side metal pillar 23 and the n-side metal pillar 24 are formed using, for example, electrolytic Cu plating.

As shown in FIG. 8C, the p-side metal pillar 23 and the n-side metal pillar 24 face each other across a resist mask 92g. The spacing between the p-side metal pillar 23 and the n-side metal pillar 24 is made wider than the spacing between the p-side interconnection layer 21 and the n-side interconnection layer 22 in order to prevent a short circuit during mounting.

Figure 9A:
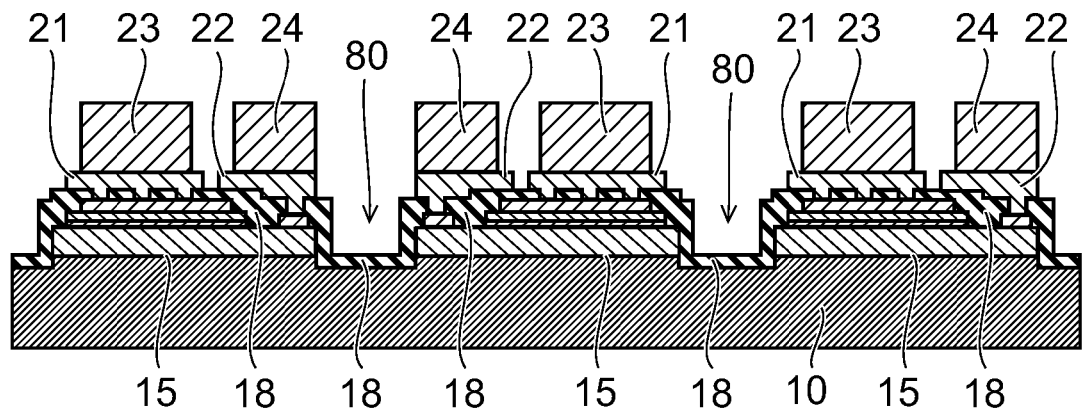
Figure 9B:
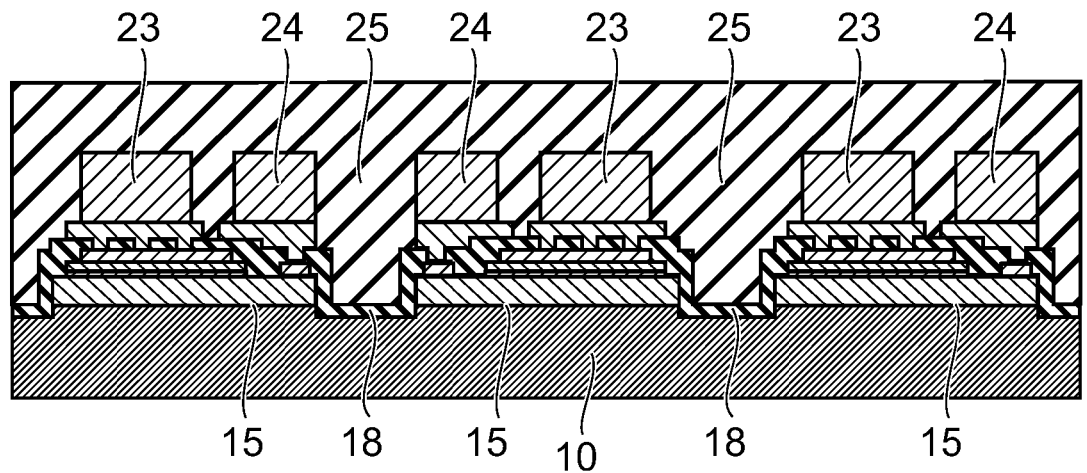

As shown in FIG. 9A, the resist mask 92 is removed using, for example, a solvent or oxygen plasma. Subsequently, as shown in FIG. 9B, the insulating film 25 is stacked as the second insulating film on the insulating film 18. The insulating film 25 covers the p-side interconnection layer 21, the n-side interconnection layer 22, the p-side metal pillar 23, and the n-side metal pillar 24.

The insulating film 25 insulates the p-side interconnection unit 41 including the p-side interconnection layer 21 and the p-side metal pillar 23 from the n-side interconnection unit 43 including the n-side interconnection layer 22 and the n-side metal pillar 24.

Figure 10A:
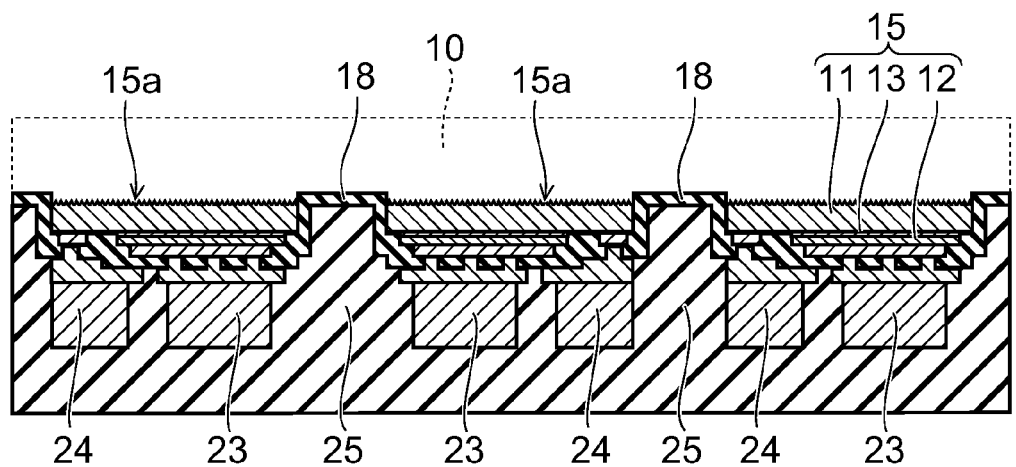

Next, as shown in FIG. 10A, the substrate 10 is removed from the semiconductor layer 15. In the case where the substrate 10 is a silicon substrate, for example, the substrate 10 can be selectively removed by wet etching. In the case where the substrate 10 is a sapphire substrate, for example, the substrate 10 can be removed using the laser lift-off method.

The substrate 10 is removed in a state where the light emitting element including the semiconductor layer 15, the p-side electrode 16, and the n-side electrode 17 is supported by the support body including the p-side metal pillar 23, the n-side metal pillar 24, and the insulating film 25. The light emitting element still keeps the state of being supported by the support body including the p-side metal pillar 23, the n-side metal pillar 24, and the insulating film 25 after the substrate 10 is removed.

The semiconductor layer 15 epitaxially grown on the substrate 10 may include a large internal stress. The p-side metal pillar 23, the n-side metal pillar 24, and the insulating film 25 are materials more flexible than the semiconductor layer 15 of, for example, a GaN-based material. Therefore, even when the internal stress due to the epitaxial growth is released at once during the peeling of the substrate 10, the p-side metal pillar 23, the n-side metal pillar 24, and the insulating film 25 absorb the stress. Therefore, damage to the semiconductor layer 15 in the process of removing the substrate 10 can be avoided.

After the substrate 10 is removed, fine concavity and convexity is formed on the first surface 15a of the semiconductor layer 15. For example, the first surface 15a is wet-etched with a KOH (potassium hydroxide) aqueous solution, TMAH (tetramethylammonium hydroxide), or the like. In this etching, a difference in the etching rate depending on the crystal plane direction occurs. Consequently, as shown in FIG. 10A, concavity and convexity can be formed on the first surface 15a. It is also possible to form a resist mask on the first surface 15a to selectively etch the first surface 15a. By forming concavity and convexity on the first surface 15a, the extraction efficiency of the radiated light of the light emitting layer 13 can be improved.

Figure 10B:
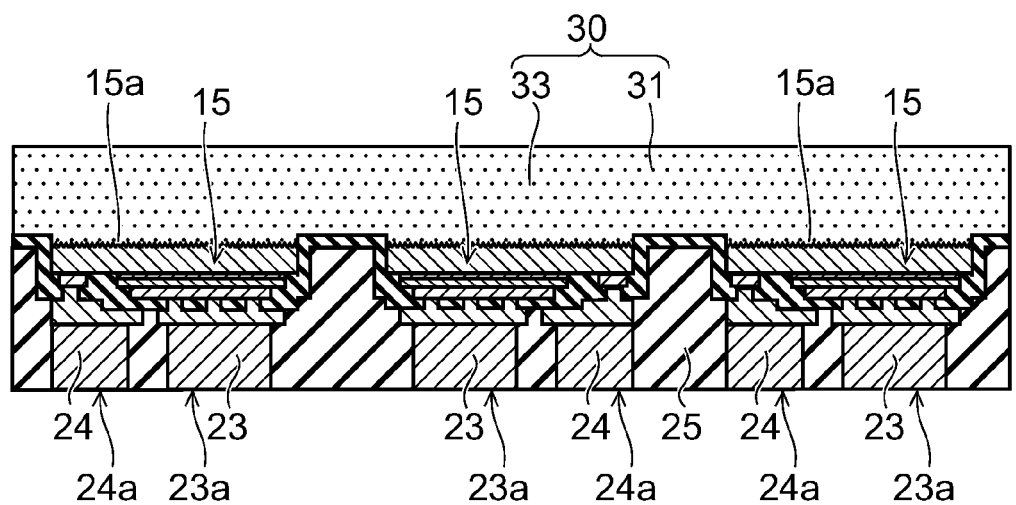

Next, as shown in FIG. 10B, the fluorescent material layer 30 is formed on the first surface 15a. The fluorescent material layer 30 contains fluorescent materials 31 and the bonding material 33, and is formed by, for example, a method such as printing, potting, molding, and compression molding.

As the fluorescent material layer 30, also a sintered fluorescent material formed by sintering fluorescent materials 31 via the bonding material 33 may be attached to the first surface 15a. For example, an adhesive containing an epoxy resin or the like (a bonding layer) is applied to the first surface 15a, and a plate containing sintered fluorescent materials 31 is pressure-bonded to the bonding layer. Thereby, the fluorescent material layer 30 is attached to the first surface 15a via the bonding layer.

The bonding material 33 is, for example, a resin such as a silicone resin, an acrylic resin, and a phenyl resin. Also a glass material may be used as the bonding material 33.

The surface (the lower surface in FIG. 10B) of the insulating film 25 is ground to expose the p-side metal pillar 23 and the n-side metal pillar 24. The exposed surface of the p-side metal pillar 23 forms the p-side external terminal 23a, and the exposed surface of the n-side metal pillar 24 forms the n-side external terminal 24a.

Figure 11A:
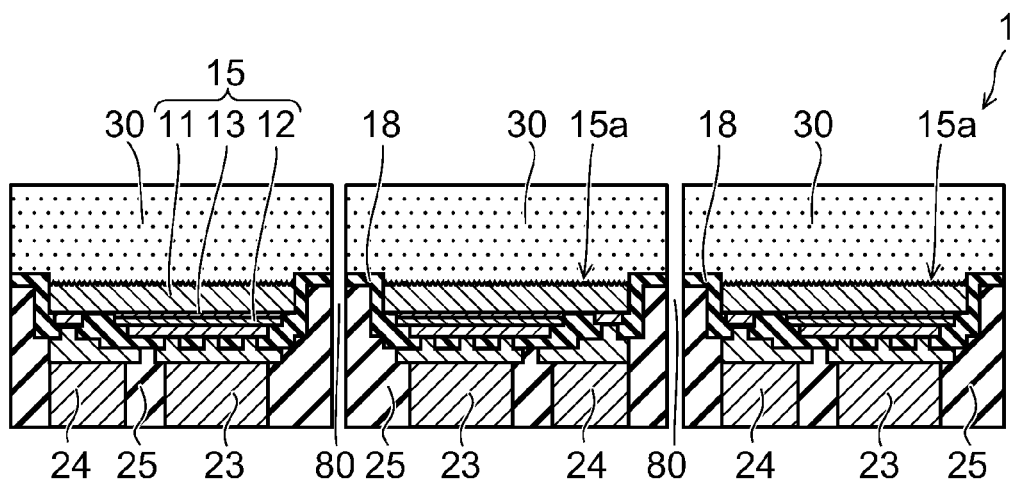
Figure 11B:
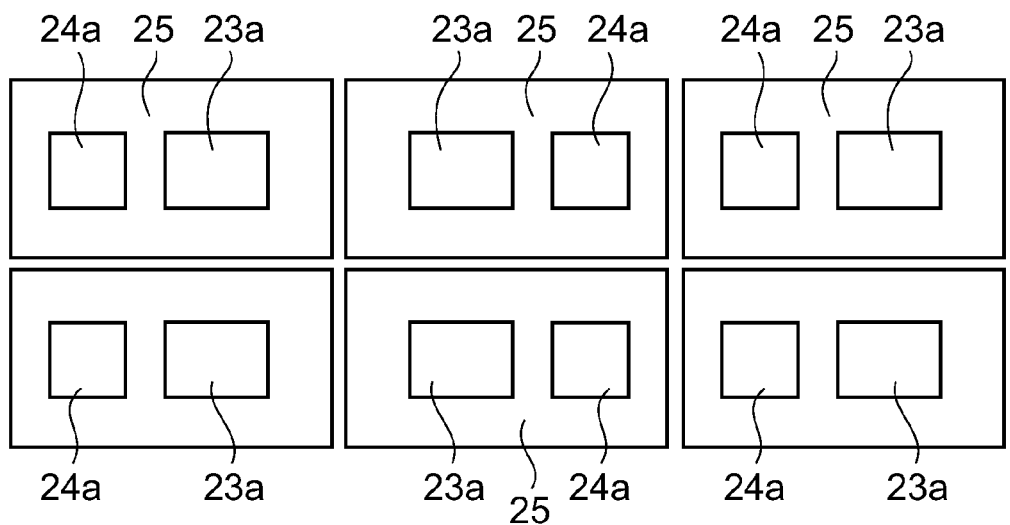

Next, as shown in FIG. 11A and FIG. 11B, the fluorescent material layer 30, the insulating film 18, and the insulating film 25 are cut at the position of the dicing region, which is the region between adjacent semiconductor layers 15. The cutting of the fluorescent material layer 30, the insulating film 18, and the insulating film 25 is performed using, for example, a dicing blade. The cutting may be performed also by laser irradiation.

The wafer is singulated as the semiconductor light emitting device 1 including at least one semiconductor layer 15. FIG. 11A shows cross sections of semiconductor light emitting devices 1, and FIG. 11B shows the lower surface of FIG. 11A and shows the mounting surface of the semiconductor light emitting device 1 at which the p-side external terminal 23a and the n-side external terminal 24a are exposed.

The semiconductor layer 15 does not exist in the dicing region, and is therefore free from damage caused by dicing. On being singulated, a structure in which the side surface of the semiconductor layer 15 is covered and protected by the insulating film 18 is obtained.

The semiconductor light emitting device 1 may be a single-chip structure including one semiconductor layer 15, or may be a multi-chip structure including a plurality of semiconductor layers 15.

Since the processes before dicing are performed collectively in a wafer state, there is no need to perform wiring and packaging for each singulated device, and a significant cost reduction is possible. That is, at the stage of being singulated, wiring and packaging have already been performed. Therefore, the embodiment can enhance productivity and can reduce manufacturing costs.

Since the fluorescent material layer 30 is formed in a wafer state, the fluorescent material layer 30 is limited to on the first surface 15a of the semiconductor layer 15 and on the support body, and is not formed to go round to the second surface of the semiconductor layer 15 and the side surface of the support body (the side surface of the insulating film 18 and the side surface of the insulating film 25).

Since the support body and the fluorescent material layer 30 are cut after they are formed in a wafer state, the side surface of the fluorescent material layer 30 and the side surfaces of the insulating films 18 and 25 forming the side surface of the support body form the side surface of the semiconductor light emitting device 1 singulated.

Therefore, the side surface of the fluorescent material layer 30, the side surface of the insulating film 18, and the side surface of the insulating film 25 are even with one another, and a small-sized semiconductor light emitting device 1 of a chip size package structure can be provided.

Second Embodiment

Figure 12A:
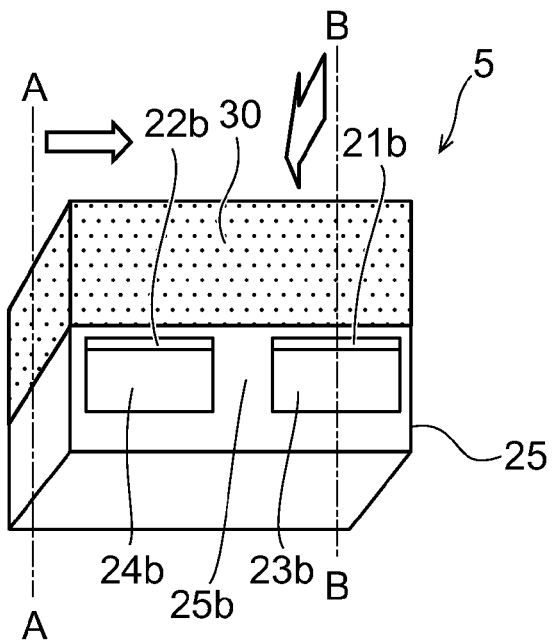
FIGS. 12A to 12C are schematic views of a semiconductor light emitting device of a second embodiment.

FIG. 12A is a schematic perspective view of a semiconductor light emitting device 5 of a second embodiment.

Figure 12B:
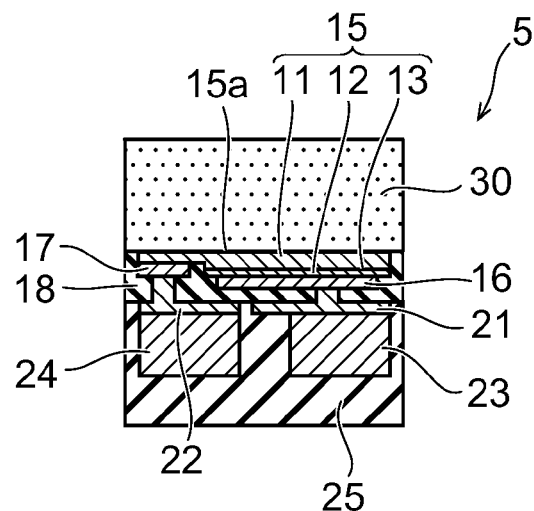

FIG. 12B is a cross-sectional view taken along line A-A in FIG. 12A.

Figure 12C:
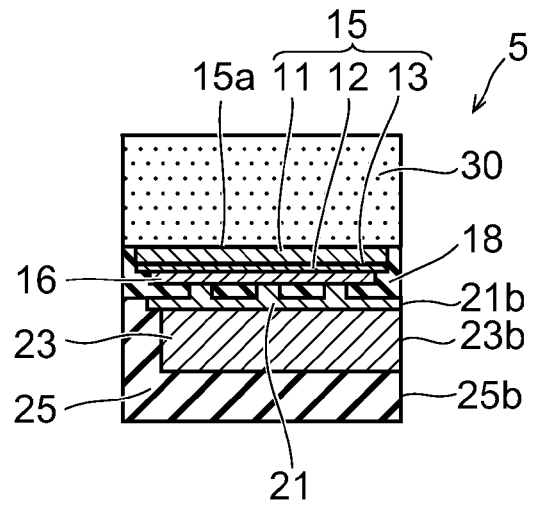

FIG. 12C is a cross-sectional view taken along line B-B in FIG. 12A.

Figure 13:
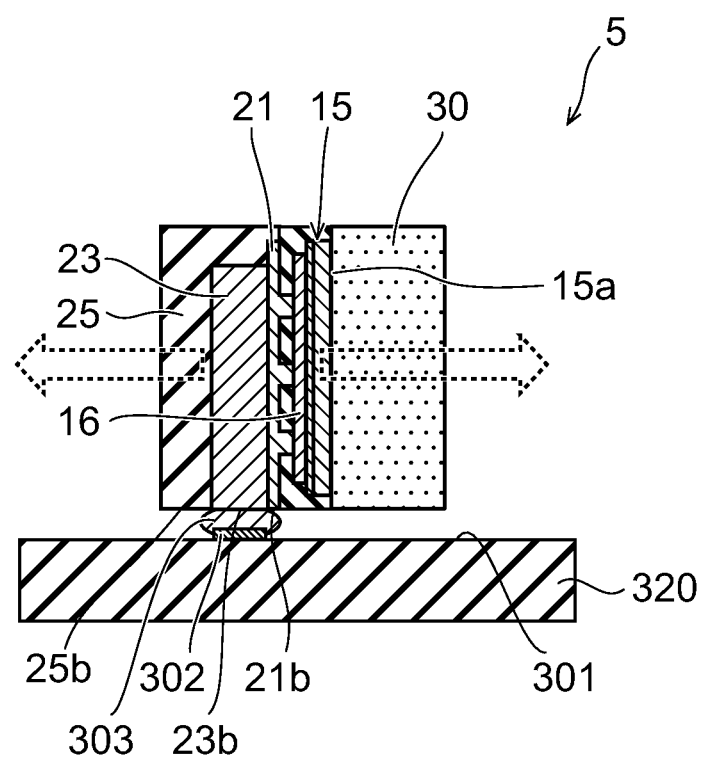
FIG. 13 is a schematic cross-sectional view of a light emitting device including the semiconductor light emitting device of the embodiment.

FIG. 13 is a schematic cross-sectional view of a light emitting device of the second embodiment.

As shown in FIG. 12A and FIG. 12C, part of the side surfaces of the p-side metal pillar 23 is exposed from the insulating film 25 at a third surface 25b that has a different plane direction from the first surface 15a and the second surface on the opposite side to it of the semiconductor layer 15. The exposed surface functions as a p-side external terminal 23b for mounting on a mounting substrate 320 shown in FIG. 13.

The third surface 25b is, for example, a surface substantially perpendicular to the first surface 15a and the second surface of the semiconductor layer 15. The insulating film 25 has, for example, four rectangular side surfaces, and one of the side surfaces is the third surface 25b.

At the same third surface 25b, part of the side surfaces of the n-side metal pillar 24 is exposed from the insulating film 25. The exposed surface functions as an n-side external terminal 24b for mounting on the external mounting substrate 320.

As shown in FIG. 12A, also part 21b of the side surfaces of the p-side interconnection layer 21 is exposed from the insulating film 25 at the third surface 25b, and functions as a p-side external terminal. Similarly, also part 22b of the side surfaces of the n-side interconnection layer 22 is exposed from the insulating film 25 at the third surface 25b, and functions as an n-side external terminal.

In the p-side metal pillar 23, the portion other than the p-side external terminal 23b exposed at the third surface 25b is covered with the insulating film 25. In the n-side metal pillar 24, the portion other than the n-side external terminal 24b exposed at the third surface 25b is covered with the insulating film 25.

In the p-side interconnection layer 21, the portion other than the side surface 21b exposed at the third surface 25b is covered with the insulating film 25. In the n-side interconnection layer 22, the portion other than the side surface 22b exposed at the third surface 25b is covered with the insulating film 25.

As shown in FIG. 13, the semiconductor light emitting device 5 is mounted in a state where the third surface 25b is opposed to the mounting surface 301 of the mounting substrate 320. The p-side external terminal 23b and the n-side external terminal 24b exposed at the third surface 25b are bonded individually to pads 302 provided on the mounting surface 301 via the solder 303. On the mounting surface 301 of the mounting substrate 320, for example, an interconnection pattern connected to an external circuit is provided, and the pads 302 are connected to the interconnection pattern. In the second embodiment, the mounting substrate 320 does not need to be transparent. For example, a resin substrate or a ceramic substrate may be used as the mounting substrate 320.

The third surface 25b is substantially perpendicular to the first surface 15a. Therefore, in a state where the third surface 25b is opposed to the mounting surface 301 side, the first surface 15a faces in the lateral direction parallel to the mounting surface 301 or in a direction inclined with respect to the mounting surface 301. That is, the semiconductor light emitting device 5 is what is called a side view-type semiconductor light emitting device, and emits light in the lateral direction parallel to the mounting surface 301 or in an oblique direction.

The radiated light of the light emitting layer 13 is radiated also to the second surface side of the semiconductor layer 15. Also in the second embodiment, the p-side electrode 16 provided in the emitting region on the second surface side is transparent to the radiated light of the light emitting layer 13. Also the insulating film 18, the p-side interconnection layer 21, the n-side interconnection layer 22, and the insulating film 25 provided on the second surface side are transparent to the radiated light of the light emitting layer 13.

Therefore, the radiated light of the light emitting layer 13 radiated to the second surface side is transmitted through the p-side electrode 16, the insulating film 18, the p-side interconnection layer 21, and the n-side interconnection layer 22; is further transmitted through the insulating film 25 between the p-side metal pillar 23 and the n-side metal pillar 24; and is radiated to the outside of the semiconductor light emitting device 5.

That is, the second embodiment provides a side view-type light emitting device in which light is radiated from two different surfaces located on opposite sides across the light emitting layer 13.

Third Embodiment

Figure 14:
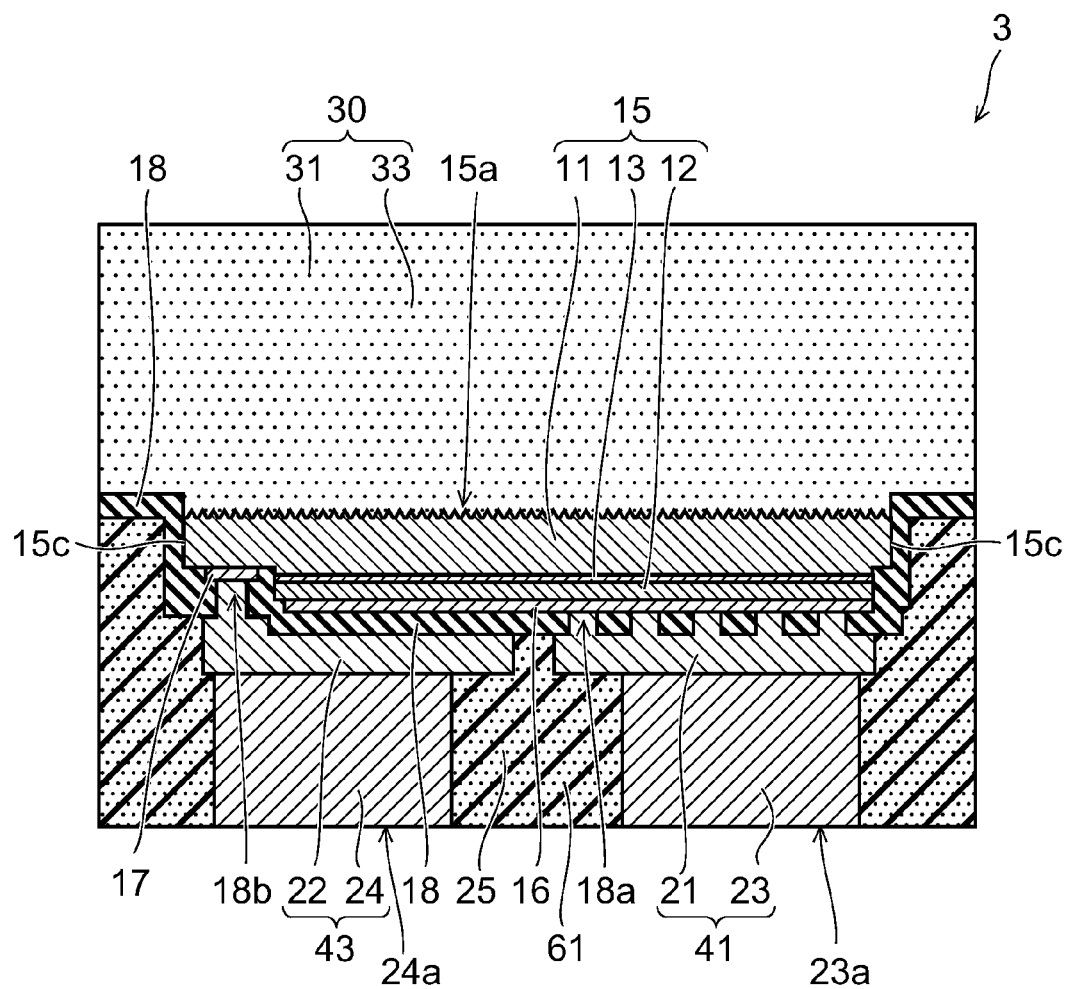
FIG. 14 is a schematic cross-sectional view of a semiconductor light emitting device of a third embodiment.

FIG. 14 is a schematic cross-sectional view of a semiconductor light emitting device 3 of a third embodiment.

Also in the third embodiment, the p-side electrode 16 provided in the emitting region on the second surface side is transparent to the radiated light of the light emitting layer 13. Also the insulating film 18, the p-side interconnection layer 21, the n-side interconnection layer 22, and the insulating film 25 provided on the second surface side are transparent to the radiated light of the light emitting layer 13.

Therefore, the radiated light of the light emitting layer 13 radiated to the second surface side is transmitted through the p-side electrode 16, the insulating film 18, the p-side interconnection layer 21, and the n-side interconnection layer 22; is further transmitted through the insulating film 25 between the p-side metal pillar 23 and the n-side metal pillar 24; and is radiated to the outside of the semiconductor light emitting device 3.

In the third embodiment, a plurality of fluorescent materials 61 are scattered in the insulating film 25. The insulating film 25 functions as a bonding material for integrating the plurality of particulate fluorescent materials 61. The fluorescent material 61 is excited by the radiated light of the light emitting layer 13, and radiates light of a different wavelength from the radiated light of the light emitting layer 13. The fluorescent material 61 is, for example, a yellow fluorescent material, a red fluorescent material, and/or a green fluorescent material. The insulating film 25 is transmissive to the radiated light of the light emitting layer 13 and the radiated light of the fluorescent material 61.

Therefore, by the third embodiment, emission of a mixed color of the radiated light of the light emitting layer 13 and the radiated light of the fluorescent material is obtained from both surfaces of the semiconductor light emitting device 3.

Also the semiconductor light emitting device 3 of the third embodiment can be configured as a light emitting device having a wide light distribution by being mounted on the transparent mounting substrate 310 as shown in FIGS. 2 and 3.

It is also possible to scatter fluorescent materials in the insulating film 25 of the side view-type semiconductor light emitting device shown in FIG. 13.

In the embodiment, the area of the second interconnection layer on the first insulating film is larger than the contact area between the second interconnection layer and the second electrode.

In the embodiment, the first metal pillar is thicker than the first interconnection layer, and the second metal pillar is thicker than the second interconnection layer.

In the embodiment, the second insulating film is provided around the first metal pillar and around the second metal pillar.

In the embodiment, the side surface of the fluorescent material layer and the side surface of the second insulating film form the side surface of the semiconductor light emitting device.

In the embodiment, the fluorescent material layer is formed on the first surface and on the second insulating film, and is not provided on the side surface of the second insulating film.

In the embodiment, the second insulating film contains a plurality of fluorescent materials that are excited by the radiated light of the light emitting layer and radiate light of a different wavelength from the radiated light of the light emitting layer.

In the embodiment, a semiconductor light emitting device mounted on one surface of the mounting substrate and a semiconductor light emitting device mounted on the other surface of the mounting substrate are mounted in positions not overlapping with each other across the mounting substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a semiconductor layer having a first surface and a second surface on an opposite side to the first surface and including a light emitting layer;
   a first electrode provided in an emitting region of the semiconductor layer on a side of the second surface;
   a second electrode provided in a non-emitting region of the semiconductor layer on the side of the second surface;
   a first insulating film provided on the side of the second surface;
   a first interconnection layer provided on the first insulating film and connected to the first electrode;
   a second interconnection layer provided on the first insulating film and connected to the second electrode;
   a first metal pillar provided on the first interconnection layer and having an externally connectable end;
   a second metal pillar provided on the second interconnection layer and having an externally connectable end;
   a second insulating film provided in contact with a side surface of the first metal pillar and a side surface of the second metal pillar between the first metal pillar and the second metal pillar; and
   a fluorescent material layer provided on a side of the first surface and including (i) a plurality of fluorescent materials excitable by radiated light of the light emitting layer and radiating light of a different wavelength from the radiated light of the light emitting layer and (ii) a bonding material integrating the plurality of fluorescent materials and transmitting the radiated light of the light emitting layer and the radiated light of the fluorescent materials;
   wherein each of the first electrode, the first insulating film, the first interconnection layer, the second interconnection layer, and the second insulating film is transparent; and
   wherein the radiated light of the light emitting layer is extractable to (i) an outside of the fluorescent material layer on the side of the first surface and (ii) an outside of the second insulating film on the side of the second surface.

2. The device according to claim 1, wherein an area of the first electrode is larger than an area of the second electrode.

3. The device according to claim 1, wherein the second interconnection layer extends on the emitting region.

4. The device according to claim 1, wherein an area of the second interconnection layer on the first insulating film is larger than a contact area between the second interconnection layer and the second electrode.

5. The device according to claim 1, wherein a contact area between the second interconnection layer and the second metal pillar is larger than a contact area between the second interconnection layer and the second electrode.

6. The device according to claim 1, wherein the first metal pillar is thicker than the first interconnection layer and the second metal pillar is thicker than the second interconnection layer.

7. The device according to claim 1, wherein the semiconductor layer does not include a substrate on the side of the first surface and the fluorescent material layer is provided on the side of the first surface without interposing a substrate between the semiconductor layer and the fluorescent material layer.

8. The device according to claim 1, wherein the second insulating film is provided around the first metal pillar and around the second metal pillar.

9. The device according to claim 8, wherein a side surface of the fluorescent material layer and a side surface of the second insulating film are even with each other.

10. The device according to claim 8, wherein a side surface of the fluorescent material layer and a side surface of the second insulating film form a side surface of the device.

11. The device according to claim 8, wherein the fluorescent material layer is provided on the first surface and on the second insulating film and is not provided on a side surface of the second insulating film.

12. The device according to claim 1, wherein the second insulating film includes a plurality of fluorescent materials excitable by the radiated light of the light emitting layer and radiating light of a different wavelength from the radiated light of the light emitting layer.

13. A light emitting device comprising:
a mounting substrate; and
a semiconductor light emitting device mounted on the mounting substrate,
the semiconductor light emitting device including:
a semiconductor layer having a first surface and a second surface on an opposite side to the first surface and including a light emitting layer;
a first electrode provided in an emitting region of the semiconductor layer on a side of the second surface;
a second electrode provided in a non-emitting region of the semiconductor layer on the side of the second surface;
a first insulating film provided on the side of the second surface;
a first interconnection layer provided on the first insulating film and connected to the first electrode;
a second interconnection layer provided on the first insulating film and connected to the second electrode;
a first metal pillar provided on the first interconnection layer and connected to the mounting substrate;
a second metal pillar provided on the second interconnection layer and connected to the mounting substrate;
a second insulating film provided in contact with a side surface of the first metal pillar and a side surface of the second metal pillar between the first metal pillar and the second metal pillar and transmitting radiated light of the light emitting layer; and
a fluorescent material layer provided on a side of the first surface and including (i) a plurality of fluorescent materials excitable by radiated light of the light emitting layer and radiating light of a different wavelength from the radiated light of the light emitting layer and (ii) a bonding material integrating the plurality of fluorescent materials and transmitting the radiated light of the light emitting layer and the radiated light of the fluorescent materials;
wherein each of the first electrode, the first insulating film, the first interconnection layer, the second interconnection layer, and the second insulating film is transparent; and
wherein the radiated light of the light emitting layer is extractable to (i) an outside of the fluorescent material layer on the side of the first surface and (ii) an outside of the second insulating film on the side of the second surface.

14. The device according to claim 13, wherein the mounting substrate transmits the radiated light of the light emitting layer.

15. The device according to claim 14, wherein a plurality of the semiconductor light emitting devices are mounted on both surfaces of the mounting substrate.

16. The device according to claim 15, wherein a semiconductor light emitting device mounted on one surface of the mounting substrate and a semiconductor light emitting device mounted on another surface of the mounting substrate are mounted in positions not overlapping with each other across the mounting substrate.

17. The device according to claim 13, wherein the second interconnection layer extends on the emitting region.

18. The device according to claim 13, wherein the semiconductor layer does not include a substrate on the side of the first surface and the fluorescent material layer is provided on the side of the first surface without interposing a substrate between the semiconductor layer and the fluorescent material layer.

19. The device according to claim 13, wherein the second insulating film is provided around the first metal pillar and around the second metal pillar.

20. The device according to claim 19, wherein a side surface of the fluorescent material layer and a side surface of the second insulating film are even with each other.

* * * * *